United States Patent

[11] 3,566,959

[72] Inventors Michael A. Koltuniak
Warren, Mich.;
Claybourne Mitchell, Jr., Ann Arbor, Mich.; Robert G. Plantholt, Rochester, Mich.
[21] Appl. No. 842,609
[22] Filed July 17, 1969
[45] Patented Mar. 2, 1971
[73] Assignee Controlled Power Corporation
Farmington, Mich.

[54] HEAT SINK

12 Claims, 4 Drawing Figs.

[52] U.S. Cl. .......... 165/80, 317/234, 317/100, 165/183
[51] Int. Cl. .......... F28f 7/00
[50] Field of Search .......... 165/80, 183—186; 234/(cl. 317); 317/1.1, 1.5, 100

[56] References Cited

UNITED STATES PATENTS 2,936,409 5/1960 Jackson et al. .......... 317/234
3,217,793 11/1965 Coe .......... 165/80
3,220,471 11/1965 Coe .......... 165/185X

*Primary Examiner*—Martin P. Schwadron
*Assistant Examiner*—Theophil W. Streule
*Attorney*—Barnes, Kisselle, Reisch & Choate

ABSTRACT: An extruded aluminum heat sink for semiconductor rectifiers and having substantially identical right- and left-hand fin sections joined by an integral transverse horizontal web so that the heat sink is symmetrical about a vertical plane through the web. Each fin section has a relatively thick trunk portion that is tapered in thickness in a direction laterally outwardly from the web. A plurality of integral fins are disposed angularly to the trunk portion and project upwardly and downwardly therefrom so that the tips of the fins define a rectangular transverse configuration. Integral with each fin section adjacent the web is a mounting leg that projects downwardly and has an outwardly turned flange at its lower end for mounting the heat sink on a support such as a copper bus bar.

INVENTORS
MICHAEL A. KOLTUNIAK
ROBERT G. PLANTHOLT
CLAYBOURNE MITCHELL, JR.
BY
Barnes, Kisselle, Raisch & Choate
ATTORNEYS

HEAT SINK

This invention relates generally to heat transfer devices for electrical components and more particularly to a heat sink for semiconductor rectifiers and the like in high amperage applications where a high heat dissipation capacity is required.

Objects of the present invention are to provide an improved heat sink that provides efficient heat transfer from a semiconductor rectifier or the like to the heat radiating surface of the heat sink; that achieves effective heat dissipation in high amperage applications, that has improved mechanical electrical and thermal properties compared to prior art heat sinks; that can be manufactured economically; that facilitates heat dissipation by radiation, natural convection and/or forced air convection; that operates effectively within a confined rectangular area; and/or that provides simple, yet effective, electrical, thermal and mechanical connections to a support such as a bus bar or the like.

Other objects, features and advantages of the present invention will become apparent in connection with the following description, the appended claims and the accompanying drawings in which:

Figures 1, 2, 3, 4:
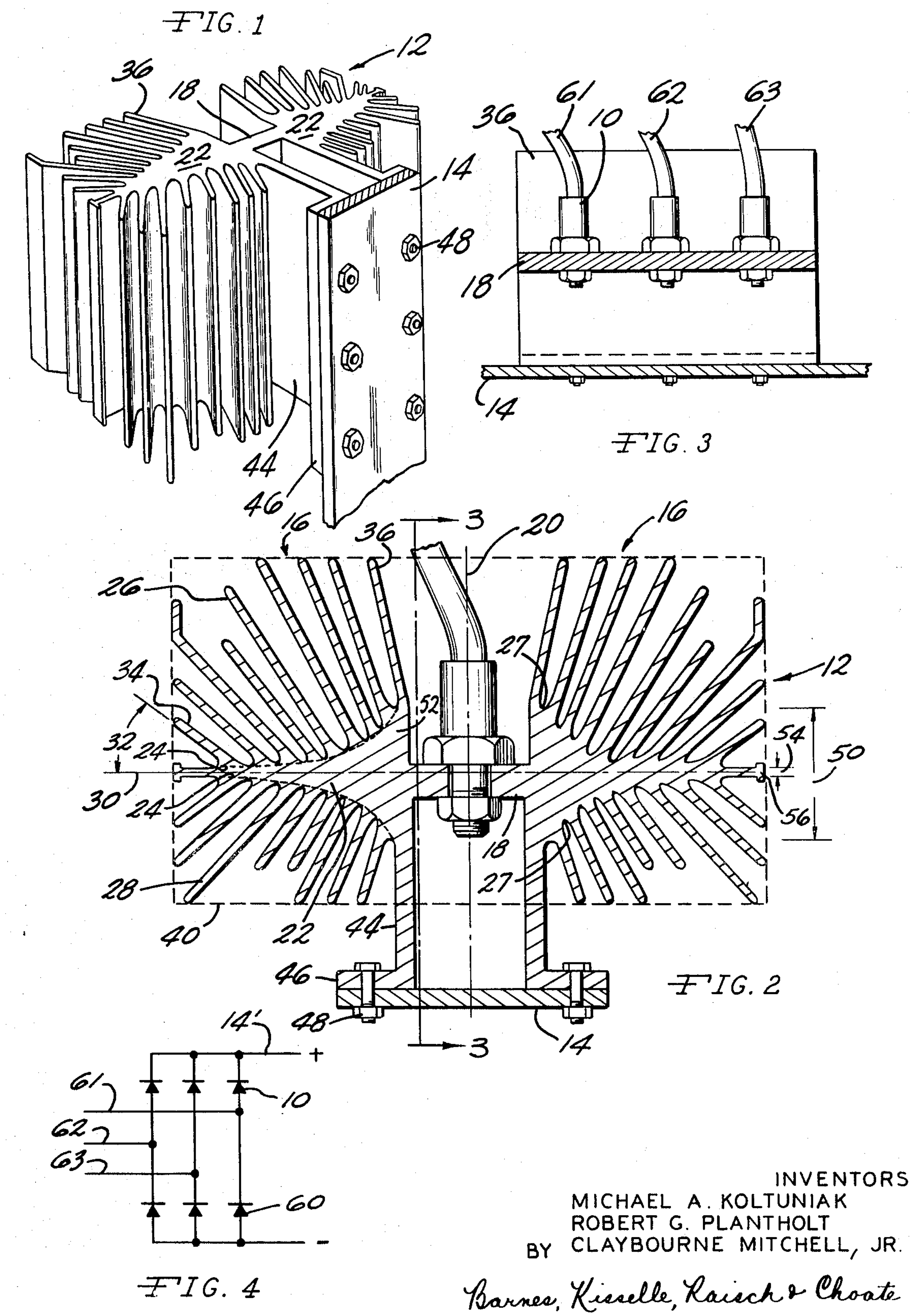
FIG. 1 is a perspective view of the heat sink mounted on a bus bar.
FIG. 2 is an enlarged transverse section through the heat sink of FIG. 1.
FIG. 3 is a vertical sectional view taken on line 3–3 of FIG. 2.
FIG. 4 is an electrical schematic of a three-phase, full-wave rectifier circuit.

Referring more particularly to the drawings, three semiconductor diode rectifiers 10 are mounted on a heat sink generally designated at 12 which, in turn, is mounted directly on an electrical bus bar 14. Heat sink 12 serves to cool rectifiers 10, provide an electrical connection between rectifiers 10 and bus bar 14 and also provide a physical mounting arrangement for rectifiers 10 on bus bar 14. The heat sink 12 generally comprises two substantially identical, right- and left-hand fin sections 16 joined by an integral transverse horizontal web 18 so that the heat sink is symmetrical about a vertical plane 20 that extends longitudinally of the heat sink 12 and passes through the transverse midpoint of heat sink 12 and web 18. In the preferred embodiment, heat sink 12 is extruded aluminum. The fin sections 16 and web 18 extend longitudinally the full length of the heat sink.

Each of the fin sections 16 generally includes a trunk portion 22 generally defined between the dashed lines 24. Each half section 16 also includes nine fins 26 projecting upwardly from the trunk portion 22 and eight fins 28 projecting downwardly from the trunk portion 22. The trunks 22, i.e., dashed lines 24, are defined by channel bottoms 27 between adjacent upper fins 26 and between adjacent lower fins 28. The trunk portions 22 and the upper fins 26 and the lower fins 28 extend longitudinally the full length of the heat sink. The upper and lower fins 26, 28, respectively, are also inclined laterally outwardly from the web 18 at an acute included angle to a horizontal plane 30 as illustrated by the angle 32 for the laterally outermost upper fin 34. By way of example, for the illustrated preferred embodiment, the acute included angle 32 formed by the fin 34 is in the order of 35° whereas the corresponding acute included angles for the innermost upper fin 36 is on the order of 75°. The fin angles progressively decrease from fin 36 to fin 32. Similarly, the angular disposition of the corresponding lower fins 28 is within the range of 70° for the laterally innermost fins to 35° for the laterally outermost fins.

The thickness of the trunk portion 22 (the vertical dimension as viewed in FIG. 2) is tapered in a direction laterally outwardly of the web 18 from a relatively thick dimension 50 at the base 52 of the trunk adjacent the web 18 to a relatively thin dimension 54 at the base of the laterally outermost fin 56. In the preferred embodiment, the ratio of the dimension 50 to the dimension 54 is on the order of approximately 12 to 1. The taper designated by lines 24 is such that the thickness of trunk portion 22 decreases progressively with the decreasing number of fins remaining in the heat path in a direction away from web 18. This taper in the trunk portion 22 together with the angular orientation of the fins 26, 28, the length of the fins and the spacing therebetween provide efficient heat transfer from the web 18 to the radiating surfaces of the fins. As illustrated in FIG. 2, the length of the fins 26 and 28 is such that the outermost free ends of the fins define a generally rectangular overall configuration for the two fin sections 16 as illustrated by the broken lines 40. The maximum length of the fins 26, 28 is limited in part by the dimension of the base of the fins where they join trunk portion 22.

Each of the fin sections 16 also includes an integral vertical leg portion 44 that projects downwardly from the juncture between trunk portion 22 and web 18 and terminates at its lower end with a right-angled flange 46 projecting in a laterally outward direction. Legs 44 and flanges 46 also extend the full length of heat sink 12. Heat sink 12 is fastened on bus bar 14 by screws 48. In addition to serving a mechanical function of mounting the heat sink 12 on bus bar 14, legs 44 also serve to conduct both heat and electrical current from rectifiers 10 to bus bar 14. The relatively large cross section of legs 44 provides a high electrical conductivity to minimize heat generation and electrical losses at high amperage. The width of bus bar 14 should be at least as great as the dimension between the laterally outermost edges of the flanges 46. The electrical and thermal interface between web 18 and rectifiers 10 as well as the electrical and thermal interface between the flanges 46 and the bus bar 14 can be finished according to known techniques to provide good thermal and electrical transfer at the interfaces. The size and transverse cross section of legs 44 also facilitates the extrusion process by compensating for the lack of symmetry of the heat sink 12 about a horizontal plane.

The large mass of heat conducting aluminum in bases 52 of the trunk 22 rapidly and efficiently conducts heat away from web 18, i.e., rectifiers 10. The tapered shape of the trunk portions 22 together with the angular orientation of the fins 26, 28 allow heat to be thermally conducted to the fins from the web 18 without abrupt direction changes and more efficiently than in heat sinks where a thin cross sectioned member attempts to force thermal conduction around large angles. On the other hand, the tapered configuration of trunk portions 22 accomplishes efficient heat transfer away from web 18 utilizing a minimum amount of material. The relatively large inner and outer surfaces of the legs 44 provide additional heat radiating surfaces; and, moreover, the large interface between the flanges 46 and the bus bar 14 provide additional heat transfer from the heat sink 12 to the bus bar 14 so that the bus bar 14 also conducts a limited amount of heat from the heat sink 12.

Referring to the circuit of FIG. 4, the three rectifiers 10 (FIG. 3) are electrically connected in a generally conventional three-phase, full-wave rectifier circuit with three additional rectifiers 60. The three-phase input leads 61, 62, 63 are connected to the anodes of a respective rectifier 10 and the cathodes of rectifiers 10 are connected together through the heat sink 12 (FIGS. 1—3) as illustrated by the common collecting bus 14' in FIG. 4. The electrical path is through web 18, legs 44 and flanges 46 to bus 14 in FIG. 2. A second set of three rectifiers 60 will similarly be connected to a second heat sink (not shown) which also serves as a common collecting bus.

In the preferred embodiment, the aluminum from which heat sink 12 is extruded is type 6063-T5 aluminum sold by the Aluminum Company of America (Alcoa). For one application involving three rectifiers 10 connected in the full wave rectifier circuit of the type shown in FIG. 4, the heat sink 12 was approximately 8 inches long. Typically, this heat sink would be used in a low DC voltage rectifier circuit (100 volts or less) developing, for example, a DC output of 12 volts at over 1000 amps. The 8 inch heat sink of uncoated aluminum weighs approximately 11 pounds (16.5 pounds per foot of extrusion) and has a volume (based on the rectangular configuration area 40) of 360 cubic inches. The height from the bottom of flanges 46 to the tip of fins 36 is 6.38 inches and the width through fins 66 is 9 inches. Web 18 is 0.44 inches thick and 1.62 inches wide. The configuration of the fins is substantially as shown in FIG. 2. This particular heat sink configuration has a two-dimensional surface length provided by fins 26 and 28 of approximately 150 inches and an overall surface length (including legs 44) of 170 inches. This particular heat sink provides a thermal resistance (semiconductor case-to-ambient), $\theta_{ca}$, of approximately 0.23° C/watt with natural convection and a linear increase in semiconductor case temperature (rise above ambient air, degrees Celsius) when plotted against power dissipated in watts; for example, at 100 watts power dissipated the semiconductor case temperature rose approximately 16.7°C and at 400 watts power dissipated the case temperature rise was approximately 89.2°C. For forced convection, measured in a duct (15¾ inches by 9½ inches cross section), the thermal resistance from the heat sink to ambient varies with air velocity as follows:

| Air velocity, ft./min.: | Thermal resistance, ° C./watt |
|---|---|
| 200 | 0.12 |
| 300 | 0.097 |
| 400 | 0.085 |
| 500 | 0.075 |
| 600 | 0.070 |
| 700 | 0.065 |

The forced convection characteristics compare favorably with more expensive heat sinks that are specially coated to enhance their thermal characteristics. Such coatings may add 10 to 15 percent to the forced convection cooling capability.

Although the heat sink 12 has been described in the preferred embodiment for applications using three rectifiers 10, for different heat dissipation requirements as, for example, more or less rectifiers, heat sinks can be made inexpensively by merely cutting the extrusion to selected lengths depending on the particular application.

We claim:

1. A heat sink for semiconductor rectifiers and the like comprising an elongated extrusion having a pair of integral fin sections that extend longitudinally of said heat sink and are joined together by an integral transverse horizontal web, said heat sink being symmetrical about a vertical plane perpendicular to said web and intersecting said web midway between said fin sections, and wherein each fin section comprises a trunk portion and a plurality of heat radiating fins which extend longitudinally of said heat sink, said trunk portions each comprising a base integral with said web, one trunk portion projects laterally outwardly from said web in one direction for one fin section and the other trunk portion projects laterally outwardly from said web in the opposite direction for said other fin section, a first plurality of said fins of at least more than four on each fin section project upwardly from a respective trunk and are inclined laterally outwardly from said web at an acute included angle to a horizontal axis of said trunk, a second plurality of said fins of at least more than four on each of said fin sections project downwardly from a respective trunk and are inclined laterally outwardly from said web at acute included angles to a horizontal axis of said trunk, and wherein each of said trunk portions is tapered in thickness from its base to its tip such that the thickness of said trunk decreases progressively in a direction laterally outwardly from said web as a function of the number of remaining fins.

2. The heat sink set forth in claim 1 wherein said heat sink further comprises first and second vertical legs disposed respectively at opposite sides of said web and integral with said trunk portion base of a respective fin section, said legs projecting downwardly below said second plurality of fins and having a lateral right angle flange thereon disposed below said second plurality of fins, said legs also extending longitudinally of said heat sink between opposite ends of said heat sink.

3. The heat sink set forth in claim 2 wherein each of said legs has a planar inner surface extending vertically from said web to said flange and longitudinally between opposite ends of said heat sink and wherein said flanges include a plurality of apertures for receiving fasteners to attach said flanges to a bus bar support.

4. The heat sink set forth in claim 1 wherein each of said fins has a free end remote from the trunk of its respective fin section with said fin ends defining a generally rectangular overall configuration to said fin sections in a transverse vertical plane.

5. The heat sink set forth in claim 1 wherein said fins provide a two-dimensional surface length of on the order of 150 to 170 inches in a transverse vertical plane.

6. The heat sink set forth in claim 1 wherein said acute included angles in said first and second plurality of fins are progressively smaller in a direction laterally outwardly from said trunk portion base toward laterally outer tips of said trunk portion.

7. The heat sink set forth in claim 6 wherein said acute included angles in said first plurality and said second plurality of fins vary progressively from about 75° to about 35° in a direction away from said web.

8. The heat sink set forth in claim 1 wherein the thickness of said trunk portion base is at least about 10 times greater than the thickness of said trunk at its laterally outer tip.

9. In combination a low voltage bus bar and a rectifier heat sink mounted directly on said bus bar wherein said bus bar has a flat planar surface for receiving said heat sink and wherein said heat sink further comprises a pair of integral fin sections that extend longitudinally of said heat sink and are joined together by an integral transverse horizontal web, said heat sink being symmetrical about a vertical plane perpendicular to said web and intersecting said web midway between said fin sections, each fin section comprises a trunk portion and a plurality of heat radiating fins which extend longitudinally of said heat sink, said trunk portions each comprising a base integral with said web, one trunk portion projects laterally outwardly from said web in one direction from one fin section and the other trunk portion projects laterally outwardly from said web in the opposite direction for said other fin section, and wherein said heat sink further comprises first and second vertical legs disposed respectively at opposite sides of said web integral with said trunk portion base of a respective fin section, each leg projects downwardly from said web below said fins, a right-angled flange on the lower end of each of said legs, said legs and said flanges extend longitudinally of said heat sink the full length thereof and wherein said flanges are fastened on said bus bar against said flat planar surface.

10. The combination set forth in claim 9 wherein said web is provided with a plurality of rectifier receiving apertures adapted to receive a plurality of semiconductor devices so that said bus bar serves as a common electrical connection for each of said rectifiers and said legs serve as the sole mechanical support for said heat sink, provide a heat transfer path from said rectifiers to said bus bar and provide an electrical connection from said rectifiers to said bus bar.

11. A heat sink for semiconductor rectifiers and the like comprising an elongated aluminum extrusion having a pair of integral fin sections that extend longitudinally of said heat sink and are joined together by an integral transverse horizontal web, said heat sink being symmetrical about a vertical plane perpendicular to said web and intersecting said web midway between said fin sections, and wherein each fin section comprises a trunk portion and a plurality of heat radiating fins which extend longitudinally of said heat sink, said trunk portions each comprising a base integral with said web, one trunk projects laterally outwardly from said web in one direction for one fin section and the other trunk portion projects laterally outwardly from said web in the opposite direction for said other fin section, a first plurality of said fins of at least more than four on each of said fin sections project upwardly from a respective trunk and are inclined laterally outwardly from said web at an acute included angle to a horizontal axis of said trunk, a second plurality of said fins of at least more than four on each of said fin sections project downwardly from a respective trunk and are inclined laterally outwardly from said web at acute included angles to a horizontal axis of said trunk, said acute included angles in said first and second plurality of fins are progressively smaller in a direction laterally outwardly from said trunk portion base toward laterally outer tips of said trunk portion, each of said trunk portions is tapered in thickness from its base to its tip such that the thickness of said trunk decreases progressively in a direction laterally outwardly from said web as a function of the number of remaining fins and wherein each of said fins has a free end remote from the trunk of its respective fin section with said fin tips defining a generally rectangular overall configuration to said fin sections in a transverse vertical plane.

12. A heat sink for semiconductor rectifiers and the like comprising a pair of integral fin sections that extend longitudinally of said heat sink and are joined together by an integral transverse horizontal web, and wherein each fin section comprises a trunk portion and a plurality of heat radiating fins which extend longitudinally of said heat sink, said trunk portions each comprising a base integral with said web, one trunk portion projects laterally outwardly from said web in one direction for one fin section and the other trunk portion projects laterally outwardly from said web in the opposite direction for said other fin section, a first plurality of said fins on each fin section project upwardly from a respective trunk and are inclined laterally outwardly from said web at an acute included angle to a horizontal axis of said trunk, a second plurality of said fins on each of said fin sections project downwardly from a respective trunk and are inclined laterally outwardly from said web at acute included angles to a horizontal axis of said trunk, and wherein each of said trunk portions is tapered in thickness from its base to its tip such that the thickness of said trunk decreases in a direction laterally outwardly from said web as a function of the number of remaining fins.